United States Patent [19]
Dell et al.

[11] Patent Number: 5,386,137
[45] Date of Patent: Jan. 31, 1995

[54] ELECTRO-OPTIC DEVICE

[75] Inventors: John M. Dell, Blackurn South, Australia; Gideon W. Yoffe, Eindhoven, Netherlands

[73] Assignee: Australian & Overseas Telecommunications Corp. Ltd., Melbourne, Australia

[21] Appl. No.: 941,429
[22] PCT Filed: Apr. 19, 1991
[86] PCT No.: PCT/AU91/00147
§ 371 Date: Dec. 11, 1992
§ 102(e) Date: Dec. 11, 1992
[87] PCT Pub. No.: WO91/16729
PCT Pub. Date: Oct. 31, 1991

[30] Foreign Application Priority Data
Apr. 20, 1990 [AU] Australia .................. 9739/90

[51] Int. Cl.[6] .................. H01L 27/14; H01L 31/00
[52] U.S. Cl. .................. 257/458; 257/184; 257/190; 257/200; 257/459
[58] Field of Search ............... 257/184, 200, 458, 459, 257/190

[56] References Cited
FOREIGN PATENT DOCUMENTS
0385803  9/1990  European Pat. Off. ............ 257/184
58-161387  9/1983  Japan ................................... 257/85

Primary Examiner—Jerome Jackson
Attorney, Agent, or Firm—Wolf, Greenfield & Sacks

[57] ABSTRACT

An electro-optic device (2) including a first part (4,6,10,16) of a first semiconductor technology and a second part (12,14) of a second semiconductor technology. The first and second parts are fabricated separately and the first part is bonded to the second part. The second part (12,14) includes light reflecting means (12) and the first part (4,6,10,16) comprises an optoelectronic hetero-structure (4,6,10,16) which, with the light reflecting means (12), forms the device (2). The device (2) comprises a modulator/detector or semiconductor laser structure.

20 Claims, 1 Drawing Sheet

ELECTRO-OPTIC DEVICE

The present invention relates to an electro-optic device and a method of fabricating the device.

A demand exists for increased computing power and processing speed in a wide range of applications, however, this is particularly evident for exchanges of broadband telecommunications networks. Perhaps, the only way to meet the demand is by employing massive parallelism in computer architectures, which gives rise to the problem of supplying the requisite interconnections to and between elements of architectures employed. The interconnection problem, however, can be overcome using optical interconnect technology, which involves the use of light sources, detectors and, for a number of particular applications, modulators. Rather than employ a large number of light sources, it is more efficient for a number of reasons, including power consumption and heat sinking, to use a single light source and a number of modulator/detector devices associated therewith.

For example, if a large array of optical fiber terminals in an exchange requires a source of light for each terminal, it is more efficient to provide the sources from a corresponding array of modulators, where each modulator receives a beam of light which has been split from a single light source using an appropriate optical grating. The array of modulators, the grating and the single light source obviate the need to provide an array of light sources for the optical terminals.

According to the above, a modulator/detector structure is required which can be simply and relatively inexpensively fabricated and can be arranged so as to form an array of modulator/detector elements on any substrate. In particular, the array structure should be able to be fabricated on Si or GaAs VLSI circuits or circuit substrates.

One form of modulator/detector comprises an asymmetric Fabry-Perot resonator structure. The structure includes a semiconductor stack having alternating layers of GaAs and AlAs as a first mirror and either the air GaAs interface or another GaAs and AlAs stack as a second mirror. A series of quantum well absorption layers are disposed between the mirrors and the entire structure is doped so as to form a pin diode. Light received by the structure is absorbed by the quantum wells according to the voltage applied across the structure. The absorption is modified according to the voltage by virtue of the quantum confined Stark effect. The effect changes the resonance of the Fabry-Perot cavity and hence the extent to which the structure reflects light received thereby can be modulated in accordance with the voltage applied across the structure. Similarly, the effect can be used to enable the structure to operate as a detector as the voltage which appears across the structure is dependent on the intensity of the light received and absorbed, by the structure. The modulator/detector structure is described in detail in a paper entitled "Low-voltage Multiple Quantum Well Reflection Modulator with On:Off Ratio>100:1, Electronics Letters, 20 July 1989, Vol 25, No 15, which is herein incorporated by way of reference.

The above modulator/detector structure, however, has a number of deficiencies and gives rise to a number of problems, particularly in fabrication on Si substrates. Most electronic control circuitry for optical modulator/detector devices is provided in Si VLSI circuits and therefore it is particularly desirable to be able to place the devices directly onto a Si substrate. To grow a GaAs structure on Si, however, is a time consuming and particularly inefficient process for the following reasons. Firstly, the Si electronic circuits need to be protected by placing a protective layer over the circuits prior to growth of the GaAs structure and the protective layer has to be removed afterwards. The GaAs structure once grown on the Si substrate also tends to be relatively large, particularly with the reflector GaAs. AlAs stack and occupies at least a 10-20 $\mu$m island on the Si substrate. The GaAs structure can be up to four times larger than the same structure grown on a GaAs substrate. Also, the quality of the structure is compromised by growth on Si instead of GaAs.

Secondly, it is difficult to accurately control the growth of the reflector stack of the modulator/detector structure described above, and the reliability of the reflector stack is uncertain by virtue of the use of AlAs. The growth of good quality, conducting AlAs is also not a trivial process.

Accordingly, an object of the present invention is to provide a device and a fabrication method which enables the above problems to be overcome, at least in part.

In accordance with the present invention there is provided an electro-optic device having:

a first part which comprises an optoelectronic heterostructure fabricated using optoelectronic technology based on group III-V compounds, such as GaAs or InP, and a second part, fabricated separately from said first part using integrated circuit technology based on the semiconductors in group IV, such as Si, or group III-V compounds, said second part including light reflecting means onto which said first part is bonded, said light reflecting means with said optoelectronic hetero-structure forming said device, which comprises a modulator/detector or semiconductor laser structure.

Preferably said light reflecting means comprises a pad.

Preferably said second part comprises a circuit substrate having said pad disposed thereon.

Preferably said second part comprises an integrated circuit which includes said pad.

Preferably said hetero-structure is mounted on said pad.

Preferably said pad is metallic.

Preferably said hetero-structure includes an electric contact which is bonded to said second part.

Preferably said first part includes an n-type AlGaAs layer, a p-type AlGaAs layer, and a plurality of quantum well absorption layers disposed therebetween, and said p-type layer is bonded to said pad.

Preferably the pad is formed from gold, silver or aluminium.

The present invention further provides a plurality of the electro-optic devices described above provided on a group IV semiconductor or group III-V compound substrate. Preferably the plurality forms an array.

The present invention also provides a method of fabricating an electric-optic device, as described above and which may optionally have any of the preferable features or aspects described above, said method comprising fabricating said first part according to said optoelectronic technology, fabricating said second part according to said integrated circuit technology, removing said first part from a substrate and bonding said first part to said second part.

A preferred embodiment of the present invention will now be described, by way of example only, with reference to the accompanying drawings, wherein.

Figure 2:
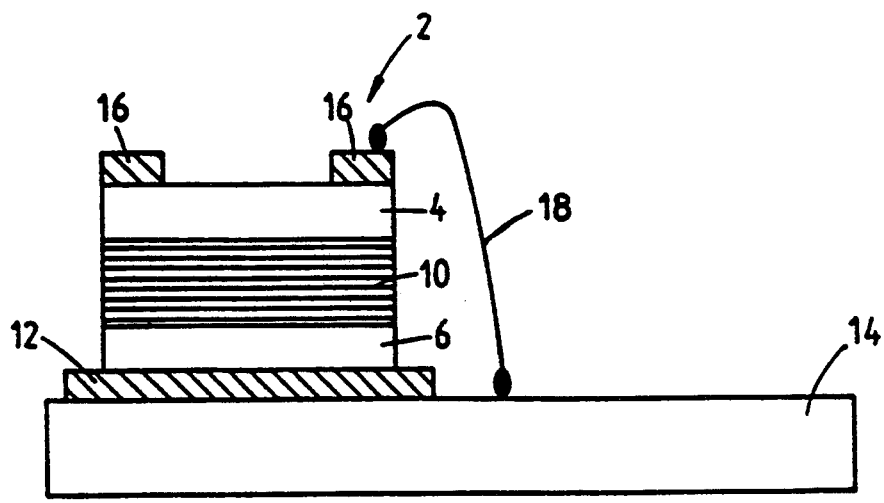
FIG. 2 is a schematic diagram of a preferred embodiment of a device according to the present invention mounted on a Si VLSI circuit.

A modulator/detector device 2, as shown in FIG. 2, comprises a n-type AlGaAs upper layer 4, a p-type AlGaAs lower layer 6 and a plurality of quantum well absorption layers 10 disposed between the upper and lower layers 4 and 6. The lower layer 6 is bonded, preferably Van der Waals bonded, to a gold pad 12 of a Si VLSI circuit 14. The upper and lower layers 4 and 6 and the absorption layers 10 are the same as the corresponding layers of the modulator/detector structure described on page 2. The gold pad 12 acts both as a mirror and as a p-type contact for the modulator/detector. The other mirror is provided by the air interface with the upper layer 4, or by a thin metallic coating on the upper surface.

The gold pad 12 replaces and obviates the need for the reflector stack discussed previously.

Metal contacts 16 are provided on top of the upper layer 4 and enable direct connection of the n-type layer 4 to the VLSI circuit 14 by means of a bonding interconnect 18, as shown in FIG. 2.

Figure 1:
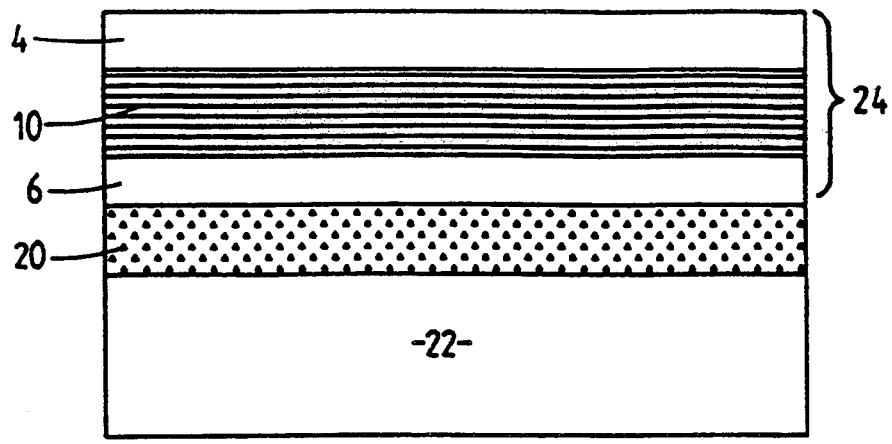
FIG. 1 is a schematic diagram of an epitaxial structure.

The device 2 is fabricated by first growing the n-type layer 4, the absorption layers 10, the p-type layer 6 and an AlAs release layer 20 on a GaAs substrate 22, as shown in FIG. 1, using an epitaxial growth technique, such as MBE, MOCVD or MOVPE. The structure grown is essentially a pin diode 24 grown on a thin layer 20 of AlAs with the intrinsic region made up of a series of quantum wells 10. The thickness of the device 24 is determined by matching the desired resonance of the Fabry-Perot cavity, formed by the resulting device 2, to the wavelength of the excitor absorption associated with the quantum wells, when the modulator/detector device 2 is reverse biased.

The air/GaAs interface has a reflectivity of approximately 0.3. The reflectivity can be increased by the addition of a quarter wave stack between the quantum wells 10 and the n-type layer 4. For example, eight periods of 630 Å $Al_{0.3}Ga_{0.7}As$ and 600 Å $Al_{0.1}Ga_{0.9}As$ has been shown to increase the reflectivity of the upper interface to 0.55.

The operating voltage of the device 2 can be reduced by the incorporation of a thin, heavily doped layer of GaAs between the n-type AlGaAs layer 4 and the metal contact 16, and the p-type AlGaAs layer 6 and the gold pad 12. In both cases, the doping of the GaAs should be the same as that of the adjacent AlGaAs layer.

A device was fabricated using an undopeal AlAs layer of 200 Å thickness. The quantum well structure 10 contained fifty 120 Å GaAs quantum wells with 60 Å $Al_{0.3}Ga_{0.7}As$ barriers. The n-type layer 4 of $Al_{0.1}Ga_{0.3}As$ was 1000 Å thick, doped $5\times10^{17}$ $cm^{-3}$ n-type. At an operating voltage of 12V, a minimum modulation depth of 3 dB was obtained over the range 857.6 to 860 nm.

The pin diode is removed from the substrate 22 using a "lift off" technique which is described in the specification of U.S. Pat. No. 4,846,931 herein incorporated by way of reference. The technique involves applying a thin coating of wax to the top of the structure 24 and etching away the release layer 20 with an etching acid, such as hydrofluoric acid or hydrochloric acid. The AlAs layer 20 can be etched away with hydrofluoric acid approximately $10^9$ times faster than GaAs, AlGaAs, InGaAs and many other semiconductor materials. As the release layer 20 is etched away, the structure 24 curls upward slightly due to the action of contracting forces in the wax which enables gaseous products of the etching process to escape from under the structure 24. Once the release layer 20 is removed, the pin diode 24 is placed on top of the gold pad 12 and the p-type layer 6 is Van der Waals bonded to the pad 12 so as to form the modulator/detector 2. The contacts 15 can be added to the n-type layer 4 before lifting off the structure 24.

The wax referred to may for instance be a black wax of the type described at page 5 of the specification of U.S. Pat. No. 4,846,931, and a wax of this type is available in Australia under the trademark "APIEZON W40" from SELBY ANAX.

The modulator/detector device 2 not only removes the requirement for the reflector stack but also occupies considerably less space than a GaAs structure grown on a Si substrate, as described previously. Furthermore, the GaAs part of the device 2 is first grown on a GaAs structure before being transplanted to a Si device 14 so the quality of this part is not compromised. Fabrication time is also reduced as one part of the device, the GaAs part, c, an be fabricated whilst the other part of the device 2, the Si part, is being fabricated. The growth of GaAs on Si is a lengthy process due to the very slow growth of GaAs initially.

The structure of the modulator/detector device 2 is particularly suited for forming large modulator/detector arrays on a Si VLSI circuit 14 in view of the fabrication and size advantages of the structure. The device 2 also alleviates the problems associated with the GaAs reflector stack structure.

We claim:

1. An electro-optic device having:
   a first part including an opto-electronic hereto-structure fabricated using opto-electronic technology based on group III-V compounds; and
   a second part fabricated separately from said first part using integrated circuit technology based on a semiconductor selected from the group consisting of group IV elements and group III-V compounds, said second part including a reflective pad;
   said first part being bonded onto said reflective pad such that the pad completely covers the opto-electronic hetero-structure to form said device.

2. An electro-optic device as claimed in claim 1, wherein said means for reflecting light comprises a pad.

3. An electro-optic device as claimed in claim 2, said second part further including a circuit substrate having said pad disposed thereon.

4. An electro-optic device as claimed in claim 2, said second part further including an integrated circuit which includes said pad.

5. An electro-optic device as claimed in claim 2, 3 or 4 wherein said hetero-structure is mounted on said pad.

6. An electro-optic device as claimed in claim 5, wherein said pad is metallic.

7. An electro-optic device as claimed in claim 6, wherein said hereto-structure includes an electric contact which is electrically connected to said second part.

8. An electro-optic device as claimed in claim 7, wherein said first part includes an n-type AlGaAs layer, a p-type AlGaAs layer, and a plurality of quantum well absorption layers disposed therebetween, and said p-type layer is bonded to said pad.

9. An electro-optic device as claimed in claim 8, wherein said pad is formed from gold.

10. An electro-optic device as claimed in claim 8, wherein a quarter wave stack of AlGaAs layers is disposed between said n-type layer and said quantum well absorption layers.

11. An electro-optic device as claimed in claim 10, wherein a heavily doped layer of GaAs is disposed between said pad and said p-type layer, and between said n-type layer and said electric contact.

12. An electro-optic array having a plurality of first parts, each first part including an opto-electronic hetero-structure fabricated using opto-electronic technology based on group III-V compounds, and a second part fabricated separately from said first part using integrated circuit technology based on a semiconductor selected from the group consisting of group IV elements and group III-V compounds, said second part including a plurality of means for reflecting light, and each first part is bonded onto a respective one of said reflective pads such that the reflective pad completely covers the first part.

13. An electro-optic array as claimed in claim 12, wherein said plurality of first parts form an array on a substrate.

14. An electro-optic device for accepting and emitting a light beam along a light path, comprising:
an opto-electronic hetero-structure part, fabricated using opto-electronic technology based on group III-V compounds, said opto-electronic heterostructure Bart including a p-type layer, a series of quantum well absorption layers formed on said p-type layer and which are transverse to said light path, and an n-type layer formed on said quantum well layers, said light path passing through said n-type layer, said quantum well layers and said p-type layer, said n-type layer having an outer surface forming a window surface transverse to said light path, said p-type layer having an outer surface, forming a substantially flat contact surface transverse to said light path; and
an integrated circuit part, fabricated separately from said opto-electronic hetero-structure part, using integrated circuit technology based on a semiconductor selected from the group consisting of group IV elements and group III-V compounds, said integrated circuit part including a conductive pad, said conductive pad having a first surface in electrical contact with a portion of said integrated circuit, and a second surface bonded to and completely covering said contact surface such that said second surface provides electrical contact with said p-type layer and forms a substantially flat reflecting surface transverse to said light path.

15. An electro-optic device as claimed in claim 14, wherein said second surface covers said contact surface.

16. An electro-optic device as claimed in claim 15, further comprising an electrical conductor connecting a node of said integrated circuit to said n-type layer.

17. An electro-optic array having a plurality of opto-electronic hetero-structure parts, each opto-electronic hetero-structure part including an opto-electronic hereto-structure for accepting a light beam along a light path, each said opto-electronic hetero-structure part fabricated using opto-electronic technology based on group III-V compounds, and including a p-type layer, a series of quantum well absorption layers transverse to said light path, formed on said p-type layer, and an n-type layer formed on said quantum well layers, said light path passing through said n-type layer, said quantum well layers and said p-type layer, said n-type layer having an outer surface forming a window surface transverse to said light path, and said p-type layer having an outer surface, forming a substantially flat contact surface transverse to said light path; and
an integrated circuit part, fabricated separately from said opto-electronic hetero-structure parts, using integrated circuit technology based on a semiconductor selected from the group consisting of group IV elements and group III-V compounds, and including a plurality of conductive pads, each conductive pad having a first surface in electrical contact with a portion of said integrated circuit, and a second surface bonded onto and completely covering the contact surface of a respective opto-electronic hetero-structure part such that said second surface provides electrical contact with the p-type layer of said respective opto-electronic hetero-structure part and forms a substantially flat reflecting surface transverse to the light path of said respective opto-electronic hetero-structure part.

18. An electro-optic array as claimed in claim 17, wherein said plurality of optoelectronic hetero-structure parts form an array on said integrated circuit part.

19. An electro-optic device as claimed in claim 8, wherein said pad is formed from silver.

20. An electro-optic device as claimed in claim 8, wherein said pad is formed from aluminum.

* * * * *

UNITED STATES PATENT AND TRADEMARK OFFICE
CERTIFICATE OF CORRECTION

PATENT NO. : 5,386,137

DATED : January 31, 1995

INVENTOR(S) : John M. Dell and Gideon W. Yoffe

It is certified that error appears in the above-identified patent and that said Letters Patent is hereby corrected as shown below:

On the title page, item [73]:

Please change the assignee to read as follows:

-- Telstra Corporation Limited, 242 Exhibition Street, Melbourne Victoria 3000, Australia --.

Signed and Sealed this

Twentieth Day of June, 1995

*Attest:*

BRUCE LEHMAN

*Attesting Officer*  *Commissioner of Patents and Trademarks*